United States Patent [19]
Morrison

[11] Patent Number: 4,884,983
[45] Date of Patent: Dec. 5, 1989

[54] RESOLDERABLE ELECTRICAL CONNECTOR

[75] Inventor: Robert A. Morrison, Long Beach, Calif.

[73] Assignee: Lockheed Corporation, Calabasas, Calif.

[21] Appl. No.: 302,287

[22] Filed: Jan. 27, 1989

[51] Int. Cl.⁴ .............................................. H01R 4/02
[52] U.S. Cl. ..................................... 439/874; 439/876
[58] Field of Search .............................. 439/629–637, 439/55, 59–62, 919, 874–876; 219/85 CA

[56] References Cited

U.S. PATENT DOCUMENTS

| | | |
|---|---|---|
| 4,517,625 | 5/1985 | Frink et al. |
| 4,723,924 | 2/1988 | Morrison |
| 4,813,128 | 3/1989 | Massopust .......................... 439/875 |

FOREIGN PATENT DOCUMENTS 0117953  9/1984  European Pat. Off. ............ 439/876

Primary Examiner—David Pirlot
Attorney, Agent, or Firm—Louis L. Dachs

[57] ABSTRACT

The electrical connector comprises a first connector half having a heating element mounted therein. The heating element includes at least one non electrically conductive surface having a set of electrically conductive surface traces mounted on the at least one surface. Also included in the first connector half are a set of first contacts having one end joined to a first portion of the surface traces on the at least one surface. A second connector half is included for mating with the first connector half. The second connector half includes a set of second electrial contacts for contacting a second portion of the surface traces on the at least one surface of the heating element when the connector halves are joined. A coating of solder is applied to the second portion of the conductive surface traces on the heating element or the one end of the second electrical contacts or both. Thus, when the first and second connector halves are joined such that the one end of the second electrical contacts are in contact with the second portions of the surface traces on the heating element, the heating element can be activated, causing the solder to melt and thereafter deactivated causing the solder to cool solidify, joining the one end of the second electrical contacts to the second portions of the surface traces on the heating element.

5 Claims, 4 Drawing Sheets

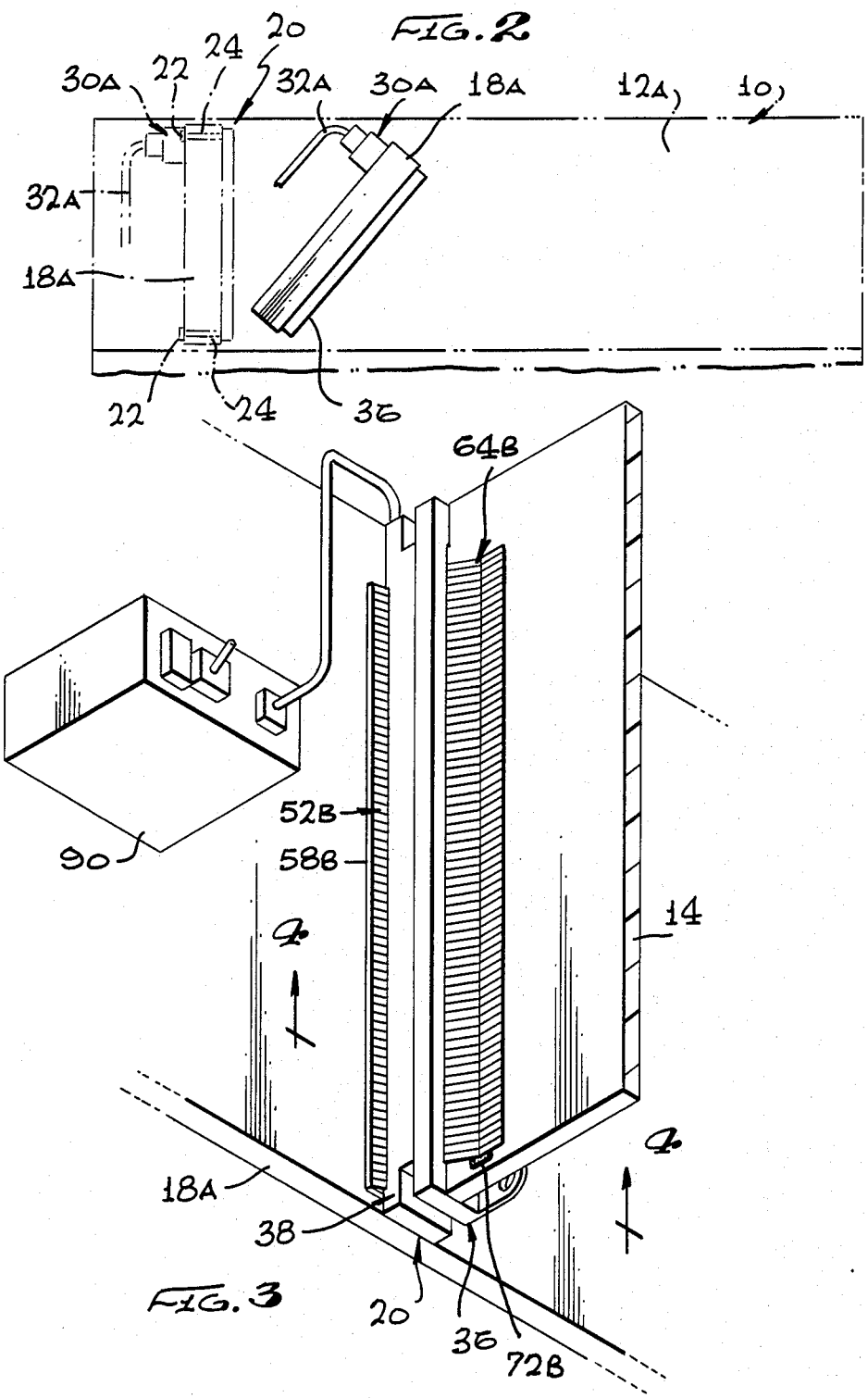

RESOLDERABLE ELECTRICAL CONNECTOR

TECHNICAL FIELD

The invention relates to the field of electrical connectors and, in particular, to electrical connectors having integral heating means that can be used to solder the contacts of the connector together.

BACKGROUND INFORMATION

In recent years, connector technology has not kept pace with the solid state circuit technologies. As the solid state chips have become capable of supporting more and more complicated circuit patterns, the input-output densities, (i.e., the fine signal wires that are necessary to communicate one circuit chip to another, usually given in the number of input-output circuits per cubic inch) are also increasing exponentially. As the density of input-output circuits increase, the maintenance and parts damage percentage have gone up and connectors have now become one of the least reliable components within electronic subsystems.

To put the problem in perspective during the vacuum tube era where considerable power was required for the vacuum tubes, it was common practice to have the complete circuit subassembly serviced by a large cable with a relatively large connector with 1/16th inch diameter pins. With the advent of circuit compression through solid state electronics these requirements have now risen to a point where it is not uncommon for a single connector to have 150, 0.30 inch diameter contacts. With this high density of small pins, it is very easy to have one or more of the pins become deflected and/or mate improperly causing poor contact or making the connector unusable. This is why connector failures have become one of the dominate failure modes in avionic equipment.

The principal way of avoiding these pin chrunching connector joining operations is to use what is commonly called a zero insertion force (ZIF) connector. In this type of connector the pins and sockets are joined without any contact of the mating surfaces themselves so that very little insertion force is necessary. With the two halves joined, a latch or cam mechanism is operated to engage all of the contacts and complete the circuit. These ZIF connectors have become very popular and sometimes very exotic. An example of zero insertion force connectors can be found in U.S. Pat. No. 4,517,625 "Circuit Board Housing with Zero Insertion Force Connector" by A. Frink et al. But even these ZIF connectors rely on a spring force to maintain contact during the vibration and shock loads encountered during operation which limits reliability.

Furthermore, certain applications do not lend themselves to use of zero insertion force connectors. For example, in integrated circuit board racks the back planes, to which the numerous circuit boards are connected to, and are located deep within the mounting cabinet where activation of a ZIF connector is impractical.

The only required interfacing of back plane segments in the past, was accomplished by using conventional connectors having hundreds of contacts, each a potential failure point. Existence of these potential points of failure resulted in a high risk condition and lowering of reliability of the back plane. An alternate method is to hard wire the back plane segments in place, but this has not been an acceptable alternative in many applications. Furthermore, field repair would be a nightmare, for the technicians are not likely to be skilled in soldering techniques nor are proper soldering tools likely to not be available.

Applicant's U.S. Pat. No. 4,723,924. "Resolderable Electrical Connector", is considered pertinent in that it provided the advantages of "hard wiring" and high density contacts. In detail, this invention comprised a first connector half having a first set of electrical contacts and a second connector half having a second set of electrical contacts. At least one of the first and second sets of electrical contacts is coated or tinned with solder. An integral heater is coupled to the first electrical connector for heating the solder to a temperature wherein the solder can be melted. Thus, the connector halves can be connected such that the first and second sets of electrical contacts are in contact. Thereafter, the contacts can be heated by applying electrical current to the heater so that the solder is "reflowed". When the electrical power is terminated the solder solidifies, thus forming a continuous and air tight path between the first and second sets of contacts. To separate the connector halves, electrical power is again applied to the heater to melt the solder and, thereafter the connector halves can be manually separated.

Thus, it is a primary object of the subject invention to provide an electrical connector that has increased reliability.

It is another primary object of the subject invention to provide an electrical connector that obtains the advantages of hard wiring while being easily separated.

A further object of the subject invention is to provide an electrical connector that is not subject to deterioration of the electrical contacts due to corrosion.

A still further object of the subject invention is to provide an electrical connector which substantially prevents the deteriorating of electrical contact with time.

Another object of the subject invention is to provide a method of mating contacts of electrical connectors that is not subject to contact separation due to vibrations, shock or accelerator loads.

An additional object of the subject invention is to provide an electrical connector with extremely high contact density.

DISCLOSURE OF THE INVENTION

The invention is an electrical connector assembly particularly suited for coupling or interfacing external wiring to the back plane and connecting segments of back planes, and additionally, to connecting individual circuit boards to the back plane or motherboard.

In general terms, the electrical connector comprises a first connector half which includes a first housing having a heating element mounted therein. The heating element includes at least one non electrically conductive surface with a plurality of electrically conductive surface traces mounted on the at least one surface. Also included in the first housing are a set of first contacts having one end joined to a first portion of the surface traces on the at least one surface. A second connector half for mating with the first connector half is provided. The second connector half includes a second housing having a plurality of second electrical contacts for contacting a second portion of the surface traces on the at least one surface of the heat element when the connector halves are joined. A coating of solder is applied to the second portion of the conductive surface traces on the heating assembly or the one end of the second electrical contacts or both. Thus, when the first and second connector halves are joined and the one end of the second electrical contacts are in contact with the second portions of the surface traces, the heating element can be activated causing the solder to melt and then thereafter deactivated, causing the solder to cool and solidify joining the one end of the second electrical contacts to the second portions of the surface traces.

In a preferred embodiment and application the connector comprises a male connector half joined to a circuit board and the female connector half joined to the motherboard. The female connector half includes a housing having a recess therein. A heating element assembly, which includes conductive surface traces on the opposite forming principal surfaces thereof is mounted in the recess. A pair of flexible circuit sheets extend through the female connector half and incorporate conductive surface traces which are joined by solder or brazing material to conductive surface traces on the motherboard and also contact a first portion of the surface traces on the electrical heater assembly.

The male connector half includes a second housing incorporating parallel legs which mate with the recess in the female connector half. The second housing further includes a pair of flexible spring-like circuit sheets bonded into slots within the housing in and which incorporate a plurality of surface traces thereon soldered or brazed at one end of the surface traces on the circuit board. They are also in contact with a second portion of the surface traces on the heating assembly. Either the surface traces on the heating assembly or the one ends of the surface traces on the circuit sheets in the male connector half or both are tinned with a lower melting point solder on and around the contact point on the second portion of the surface traces on the heating assembly.

Joining and unjoining can be simply accomplished by installing the circuit board into the appropriate slot in its electronic enclosure until the male and female connector halves are joined, such that the surface traces on the circuit sheets of the male connector half make contact with the surface traces on the heater assembly. A power supply is then coupled to the heating assembly and activated causing it to heat and melt the solder at the contact point. The power supply is then deactivated allowing the solder to solidify making a strong, air tight joint. The other joints are unaffected by the application by the relatively low levels of heat. Separation is accomplished by the reverse of the procedure.

In an alternate design, a circuit board can be coupled to a second circuit board by connecting the female half to the second circuit board and reconfiguring the circuit sheets within the female connector half to contact the surface traces on the second circuit board.

The novel features which are believed to be characteristic of the invention, both as to its organization and method of operation, together with further objects and advantages thereof, will be better understood from the following description in connection with the accompanying drawings in which presently preferred embodiments of the invention are illustrated by way of examples. It is to be expressly understood, however, that the drawings are for purposes of illustration and description only and are not intended as a definition of the limits of the invention.

BRIEF DESCRIPTION OF THE DRAWINGS

Illustrated in FIG. 1 is a perspective view of an integrated circuit board housing.

Illustrated in FIG. 2 is a partial cross-sectional view of the housing shown in FIG. 1.

Figure 1:
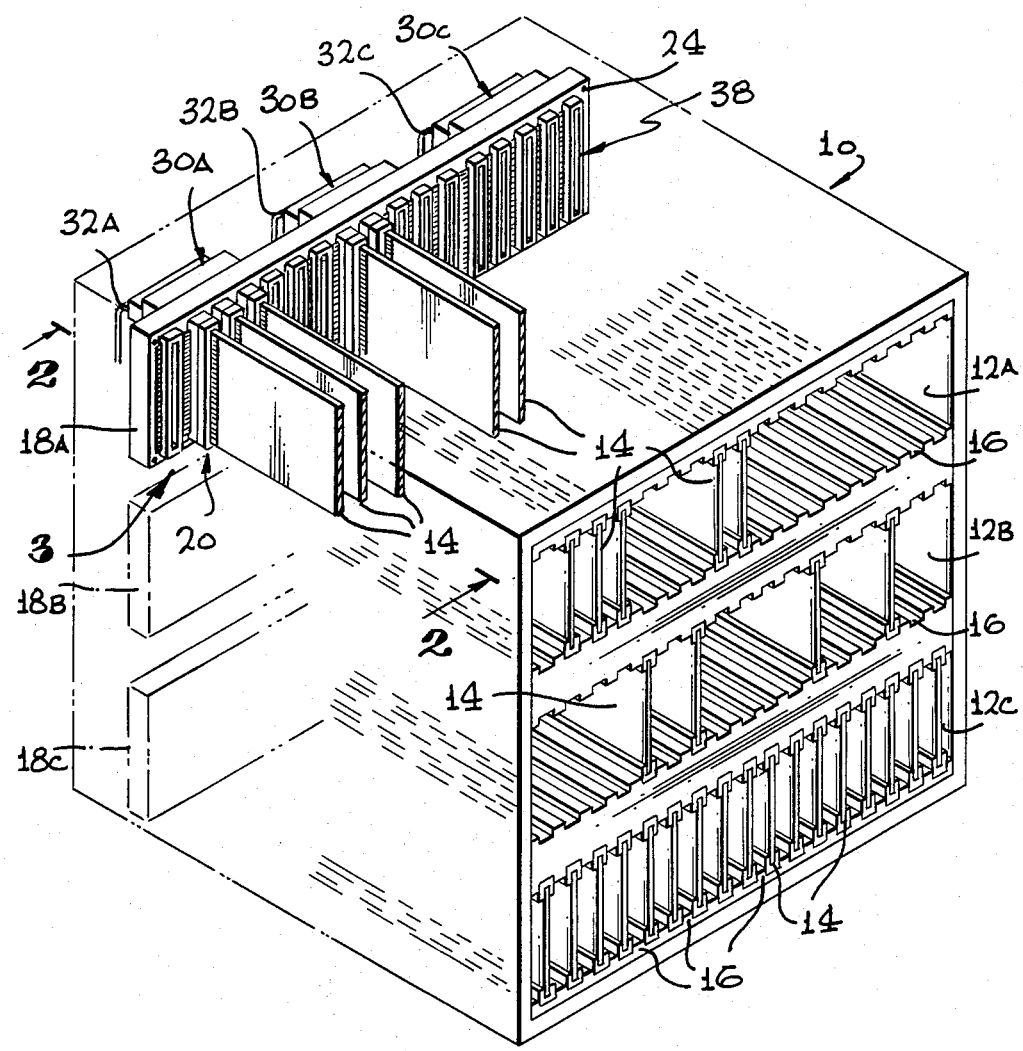

Illustrated in FIG. 3 is an enlarged view of a portion of the housing shown in FIG. 1 taken along the arrow, particularly showing the connection of an individual circuit board to the motherboard.

Figure 4:
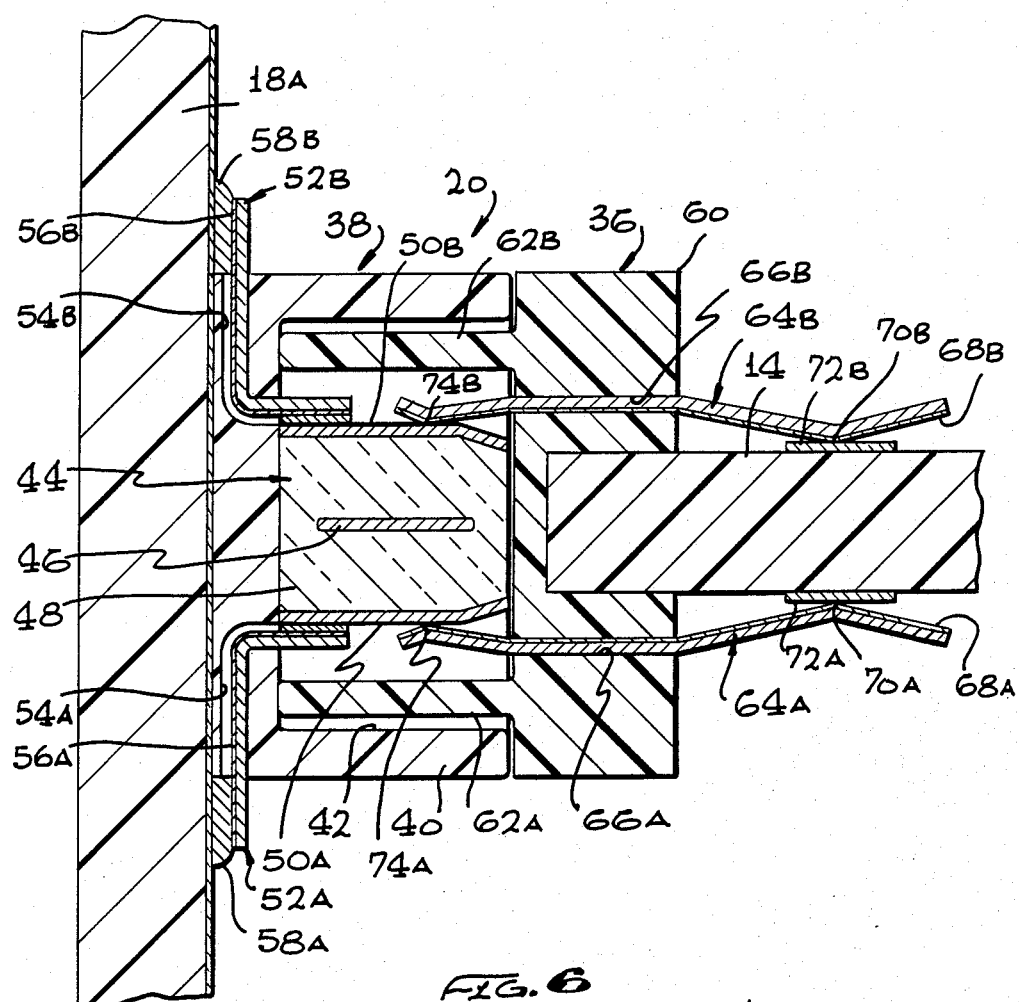

Illustrated in FIG. 4 is an enlarged cross-sectional view of FIG. 3 taken along the line 4—4, particularly showing the mated internal resolderable electrical connector half on the motherboard and circuit board.

Figure 5:
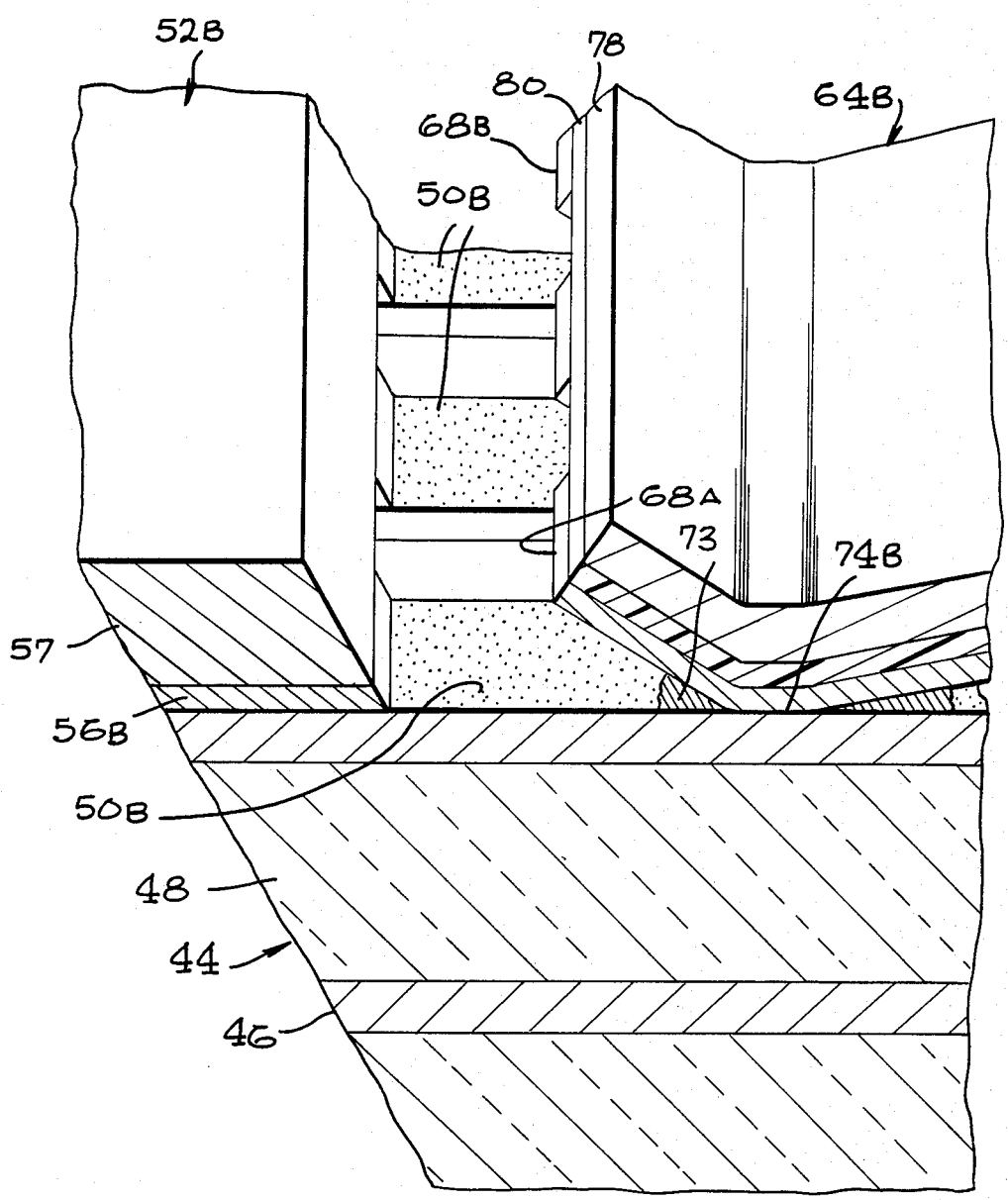

Illustrated in FIG. 5 is a partial perspective view of the heating element shown in FIG. 4, particularly illustrating photoetched surface traces on the heater.

Figure 6:
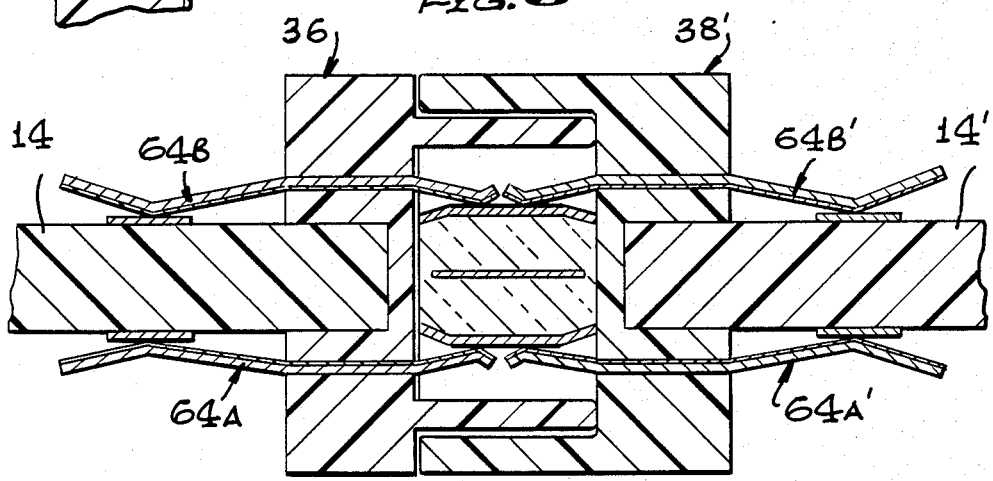

Illustrated in FIG. 6 is a cross-sectional view of a second embodiment of the subject resolderable electrical connector assembly similar to that illustrated in FIG. 4 for joining two circuit boards together.

BEST MODE FOR CARRYING OUT THE INVENTION

Illustrated in FIG. 1, is a perspective view of an electronic circuit board housing, generally designated by numeral 10, while illustrated in FIG. 2 is a partial cross-sectional view of the housing shown in FIG. 1 taken along the line 2—2. The housing 10 has three circuit board racks 12A, 12B and 12C in which numerous circuit boards 14 are shown mounted therein on tracks 16. The circuit boards 14 are coupled to back plane panels 18A, 18B and 18C by multiple contact connectors 20 mounted thereon and the back plane itself is fastened to supports 22 by means of fasteners 24. On the back plane 18A, (which is typical) are three identical connector assemblies 30A, 30B and 30C, coupling flat wire harnesses 32A, 32B and 32C respectively, thereto.

Illustrated in FIG. 3, is an larged perspective view of a portion of FIG. 1 taken along the arrow 3, showing the electrical connector 20, while illustrated in FIG. 4, is a cross-sectional view of the connector 20 shown in FIG. 3, taken along the line 4—4. Illustrated in FIG. 5, is an enlarged partial perspective view of the interior of the connector 20 particularly illustrating the resolderable connector features.

Still referring to FIGS. 1 and 2, and additionally to FIGS. 3, 4 and 5, it can be seen that the connector 20 comprises a male connector half 36, joined to the circuit board 14 and a female connector half 38 mounted on the motherboard 18A. The female connector half 38 comprises a housing 40 having a recess 42, in which is mounted a heating element assembly 44. The heating element assembly 44 comprises a metal resistance heating bar 46 cast within a ceramic body 48. The ceramic body 48 opposed principal surfaces thereof, preferably, photoetched to achieve close spacing.

A pair of flexible circuit sheets 52A and 52B are mounted within and extend through slots 54A and 54B, respectively, in housing 40. These circuit sheets 52A and 52B include contacts in the form of conductive surface traces 56 and 56B, respectively, which are joined by solder or brazing material to conductive surface traces 58A and 58B, on the motherboard 18A and also joined to a first portion of surface traces 50A and 50B, respectively, on the electrical heater assembly 44. The flexible circuit sheets, typically are made of nonconductive KAPTON sheet, indicated by numeral 57

(best seen in FIG. 5) upon which the surface traces 56A and 56B made of photoetched metal are deposited thereon.

The male connector half 36 comprises a housing 60 having parallel legs 62A and 62B, which mate with the recess 42 in the female connector half 38. The circuit connector half 36 further includes a pair of flexible spring-like circuit sheet 64A and 64B bonded into slots 66A and 66B, respectively, in the housing 60. The sheets 64A and 64B incorporate a plurality of contacts 68A and 68B in the form of surface traces brazed or soldered at points 70A and 70B to surface traces 68A and 68B are also soldered by means of a lower temperature solder at points 74A and 74B to a second portion of surface traces 50A and 50B, respectively, on heating assembly 44 (best seen in FIG. 5).

Also, best seen in FIG. 5, the circuit sheets 64A and 64B are, preferably made of Beryllium Copper sheet 78 and approximately 0.008 inch thick having a non-conductive layer of KAPTON 80, 0.003 inch thick (best seen in FIG. 5), bonded thereto with the surface traces made of photoetched copper. The shape of the sheet 64A and 64B are such that they apply a "spring" force to the surface traces 50A and 50B at points 74A and 74B and at 70A and 70B. The lower melting temperature solder can be applied to either the traces 50A or 50B or traces 68A and 68B or both, in the vicinity of the points 74A and 74B.

Particularly referring to FIGS. 1-3 it can be seen that joining and unjoining can be simply accomplished by installing the circuit board 14 into the slot 16 until the connector halves 36A and 38 are joined, such that the circuit sheet 64A and 64B make contact with the circuit traces 50A and 50B. A power supply 90 (shown in FIG. 3) is coupled to the electrical heating assembly 44 causing the element 46 to heat up, in turn heating the ceramic body 48 and, finally melting the solder at the points 74A and 74B. The power is then turned off allowing the solder to solidify making a strong, air tight joint. Since the surface sheets 56A and 56B are soldered with a higher melting point solder or braised to the circuit traces 50A and 50B and the circuit sheets 68A and 68B are similarly joined to circuit traces 72A and 72B, these joints are unaffected by the application of the relatively low levels of heat. Separation is accomplished by the reverse of the procedure.

Illustrated in FIG. 6 is an alternate design, wherein the circuit board 14 is shown coupled to a circuit board 14' by means of a connector 20'. Here the male connector half 36 is coupled to a modified female connector half 38', similar to female connector half 38 shown in FIG. 4, except that the circuit sheets 64A' and 64B' are similar to circuit sheets 64A and 64B are similar to circuit sheets 64A and 64B and connect to circuit board 14'. All other features are identical to the design shown in FIGS. 1-5 and the method of joining and unjoining is identical. Finally, it should be noted that the connector could be manufactured with surface traces only on one side of the element and only one circuit sheet in each half of the connector, if design requirements so required. Furthermore, while the embodiments illustrated and discussed in detail are directed at connecting circuit boards to motherboards and circuit boards to circuit boards. The connector is certainly not limited to such applications.

While the invention has been described with reference to particular embodiments, it should be understood that the embodiments are merely illustrative as there are numerous variations and modifications which may be made by those skilled in the art. Thus, the invention is to be construed as being limited only by the spirit and scope of the appended claims.

Industrial Applicability

The invention has applicability to all electrical systems which have components that must be periodically separated.

I claim:

1. An electrical connector comprising:
 a first connector half comprising:
   a first housing;
   a heating element mounted within said first housing said heating element further having at least one non-electrically conductive surface, said element having a set of electrically conductive surface traces mounted on said at least one surface; and
   a set of first contacts mounted in said first housing having one end of said first contacts joined to a first portion of said surface traces on said at least one surface;
 a second connector half for mating with said first half comprising:
   a second housing; and
   a set of second electrical contacts mounted in said second housing for contacting a second portion of said surface traces on said at least one non-conductive surface when said connector halves are joined; and
 a coating of solder on said second portion of said surface traces or said one end of said second electrical contacts or both;
 such that when said first and second connector halves are joined and said one ends of said second electrical contacts are in contact with said second portions of said surface traces on said heating element, said heating element can be activated to melt said solder and thereafter deactivated, causing said solder to cool deactivated and solidify, joining said one ends of said second electrical contacts to said second portions of said surface traces.

2. The electrical connector as set forth in claim 1 wherein:
 said heating element includes a second opposite facing non-electrically conductive surface;
 said conductive surface traces also mounted on said second surface;
 said set of first contacts also joined to said first portions of said surface traces on said second surface;
 said set of second contacts also in contact with said second portions of said surface traces on said second surface when said connector halves are joined; and
 said coating of solder also either on said second portions of said surface traces on said second surface or said second contacts in contact with said second portion of said surface traces on said second surface or both.

3. The electrical connector as set forth in claim 1 or 2, wherein said conductive traces on said heating element are photoetched metal.

4. The electrical connector as set forth in claim 3, wherein said contacts are photoetched metal on a non-conductive substrate.

5. The electrical connector as set forth in claim 4, wherein said first connector half is coupled to a motherboard mounted within an electronic enclosure and said second connector half is coupled to a circuit board mountable in said electronic enclosure.

* * * * *